United States Patent [19]
Drapac et al.

[11] Patent Number: 5,744,984
[45] Date of Patent: Apr. 28, 1998

[54] DRIVER CIRCUIT PROVIDING CONTROLLABLE BATTERY OVERLOAD PROTECTION

[75] Inventors: George A. Drapac, Boca Raton; Keith E. Jackoski, Wellington; Paul J. Godfrey, Melbourne; Gary L. Pace, Boca Raton, all of Fla.

[73] Assignee: Motorola, Inc., Schaumburg, Ill.

[21] Appl. No.: 748,641

[22] Filed: Nov. 13, 1996

Related U.S. Application Data

[63] Continuation-in-part of Ser. No. 363,785, Dec. 27, 1994, Pat. No. 5,585,749.
[51] Int. Cl.$^6$ .................................................. H03K 5/153
[52] U.S. Cl. ............................. 327/89; 327/77; 327/108; 324/433
[58] Field of Search ............................ 324/433; 321/108, 321/109, 110, 111, 77, 89, 530, 538

[56] References Cited

U.S. PATENT DOCUMENTS 5,095,308  3/1992  Hewitt ............................ 340/825.44

Primary Examiner—Timothy P. Callahan
Assistant Examiner—Jeffrey Zweizig
Attorney, Agent, or Firm—Philip P. Macnak

[57] ABSTRACT

A driver circuit (100) is utilized to drive a high current load (116) in an electronic device powered by a battery (118) having a terminal voltage which varies in relation to a level of energy being consumed. The driver circuit (100) includes a differential amplifier (110) which is responsive to a predetermined reference voltage and to the terminal voltage for generating a drive control signal which proportionally reduces a current supplied to the high current load (114) when the terminal voltage is substantially equal to and lower than the predetermined reference voltage. A slope control element (112) is coupled to the differential amplifier (110) to control a rate at which the drive control signal reduces proportionally the current supplied to the high current load (116). A load control element (114), coupled to the differential amplifier (100), provides the supply of current to the high current load (116).

20 Claims, 6 Drawing Sheets 5,744,984

DRIVER CIRCUIT PROVIDING CONTROLLABLE BATTERY OVERLOAD PROTECTION

CROSS-REFERENCE TO RELATED APPLICATION

This is a continuation-in-part of U.S. patent application Ser No. 08/363785 filed Dec. 27, 1994 by Pace et al., U.S. Pat. No. 5,585,749 entitled "High Current Driver Providing Battery Overload Protection".

FIELD OF THE INVENTION

This invention relates in general to driver circuits for driving high current loads utilized in battery powered electronic devices, and more particularly to a driver circuit which provides controllable battery overload protection.

DESCRIPTION OF THE PRIOR ART

Battery powered electronic devices, and in particular communication receivers, such an pagers, have utilized driver circuits to drive audio transducers and vibrators to alert the user that a message has been received. Such alerting devices generally place a high load current on the battery when the alerting device is activated, and in a number of instances can result in the battery voltage drooping to a level where the communication receiver, or pager, will not operate. In addition, many battery powered communication receivers, such as pagers, have utilized display backlighting devices, such as lamps, to provide display backlighting when the ambient light level is low. The lamps also generally place a high load current on the battery when the lamp is activated, and in a number of instances can also result in the battery voltage drooping to a level where the communication receiver, or pager, will not operate.

One instance where such detrimental effect can occur is toward the end of life of the battery, during which time the internal cell impedance increases to a point such that the battery terminal voltage can droop dramatically when a high current load, such as an alerting device or display backlighting device, is activated. Another instance where such detrimental effect can occur is when a battery which has intrinsically a high internal impedance, such as a zinc-air battery or a carbon zinc battery is utilized. Even though the battery is new, it may be only within a very short period of time that the high current load of the alerting device or display backlighting device can result in failure of the communication receiver, or pager, to properly function; or when a low battery indicator function is provided within the communication receiver, to prematurely provide a low battery indication. Such a premature low battery indication more often than not leads to extreme user discontent.

In order to reduce the likelihood of such a premature low battery indication, or communication receiver malfunction, some prior art receivers have relied on a "load shedding" technique to extend the apparent battery life. In such a "load shedding" technique, as the battery terminal voltage deteriorates due to normal energy consumption, the various alerting functions are inhibited in an order related to their energy consumption. Thus, in a pager which provided audible, tactile and visual alert capability, the tactile alerting function would be inhibited first, followed by the visual alerting function, and finally by the audible alerting function. As the functionality of the pager was reduced, the user would know that it is time to replace the battery, while still being able to retain a level of message reception.

What is needed is a driver circuit which can gradually reduce the power consumption of an alerting device or display backlighting device, thereby extending the relative life of the battery, which is particularly important when a high internal cell resistance battery is utilized in the battery powered electronic device, such as a communication receiver, or pager. Also what is needed is a driver circuit which gradually reduces the power consumption in a manner which is optimal for the type of battery being utilized, and the type of load being driven.

SUMMARY OF THE INVENTION

In accordance with a first embodiment of the present invention, a driver circuit for driving a high current load in an electronic device powered by a battery which has a terminal voltage which varies substantially in relation to a level of energy being consumed from the battery includes a differential amplifier, a slope control element, and a load control element. The differential amplifier is responsive to a predetermined reference voltage and to the terminal voltage for generating a drive control signal which proportionally reduces a current supplied to the high current load when the terminal voltage is substantially equal to and lower than the predetermined reference voltage. The slope control element is coupled to the differential amplifier and controls a rate at which the drive control signal reduces proportionally the current supplied to the high current load. The load control element provides a supply of current to the high current load, the current supplied being proportionally reduced in response to the drive control signal.

In accordance with a second embodiment of the present invention, a driver circuit used to drive a high current load in an electronic device powered by a battery which has a terminal voltage which varies substantially in relation to a level of energy being consumed from the battery includes a voltage reference, a differential amplifier, a slope control element and a load control element. The reference voltage generates a predetermined voltage reference. The differential amplifier is responsive to the predetermined reference voltage and to the terminal voltage for generating a drive control signal which proportionally reduces a current supplied to the high current load when the terminal voltage is substantially equal to and lower than the predetermined reference voltage. The slope control element is coupled to the differential amplifier and controls a rate at which the drive control signal reduces proportionally the current supplied to the high current load. The load control element provides a supply of current to the high current load, the current supplied being proportionally reduced in response to the drive control signal.

In accordance with an aspect of the present invention a communication receiver powered by a battery comprises a receiver, a decoder, a high current alerting device and a driver circuit. The receiver receives and detects coded message signals including an address signal. The decoder is responsive to the detected address signal for generating an alert enable signal when the received address signal matches a predetermined address designating the communication receiver. The high current alerting device is used to generate a sensible alert. The driver circuit includes a voltage reference, a differential amplifier, a slope control element and a load control element. The reference voltage generates a predetermined voltage reference. The differential amplifier is responsive to the predetermined reference voltage and to the terminal voltage for generating a drive control signal which proportionally reduces a current supplied to the high current load when the terminal voltage is substantially equal to and lower than the predetermined reference voltage. The slope control element is coupled to the differential amplifier and controls a rate at which the drive control signal reduces proportionally the current supplied to the high current load. The load control element provides a supply of current to the high current load, the current supplied being proportionally reduced in response to the drive control signal.

DESCRIPTION OF THE PREFERRED EMBODIMENTS

Figure 1:
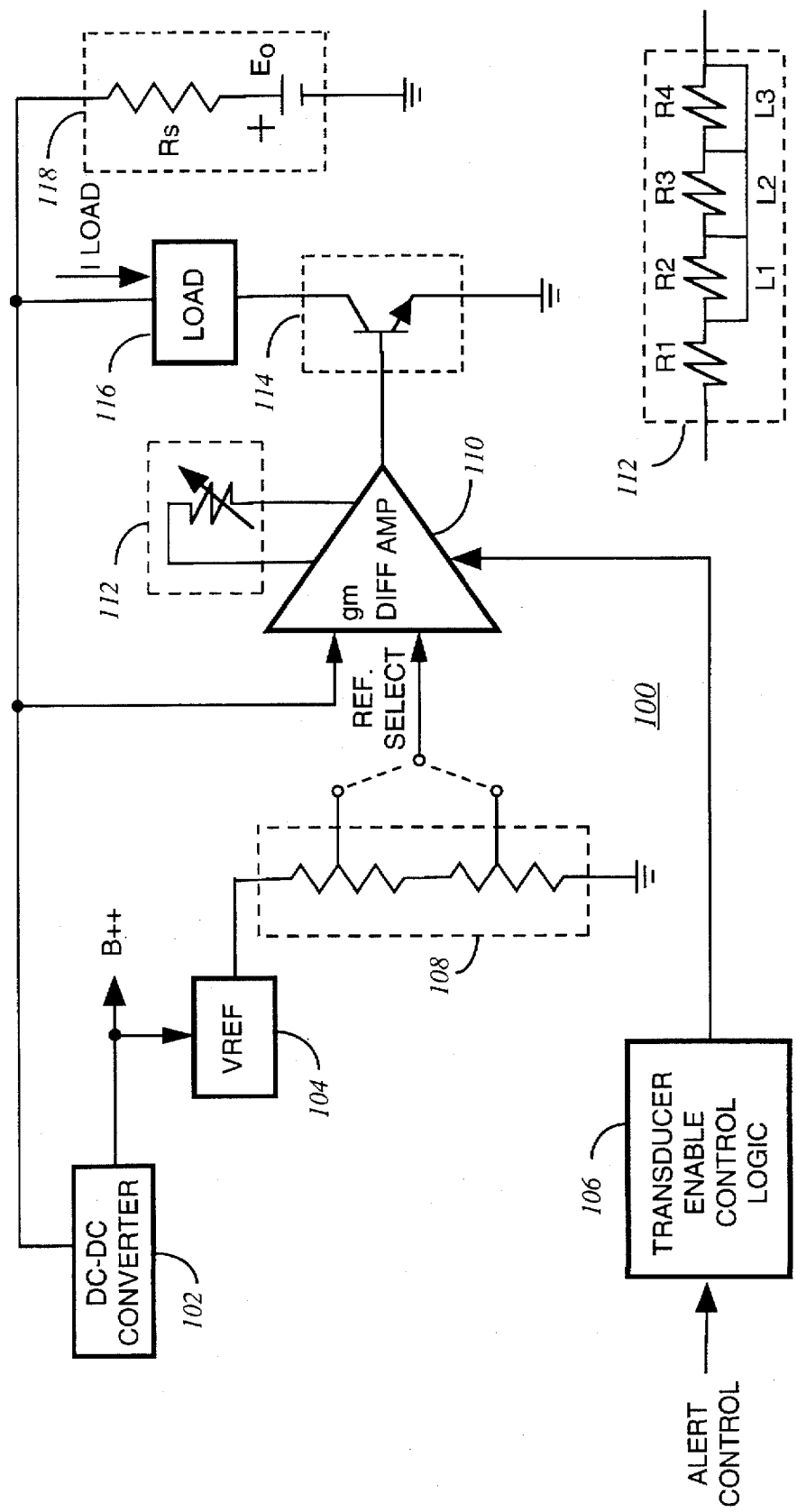
FIG. 1 is an electrical block diagram of a driver circuit providing controllable battery overload protection in accordance with the present invention.

FIG. 1 is an electrical block diagram of a driver circuit 100 providing controllable battery overload protection in accordance with the present invention. The driver circuit 100 includes a voltage reference 104, a voltage divider 108, a differential amplifier 110, a slope control element 112, and a load control element 114. Coupled to the driver circuit 100 is a DC-DC converter 102, transducer enable control logic 106, a high current load 116 and a battery 118.

The battery 118 is represented by an ideal voltage source Eo and an internal cell resistance Rs. It will be appreciated that the magnitudes of the ideal voltage source Eo and the internal cell resistance Rs vary according to the type of battery; the battery condition, i.e., new or at end-of-life; and the magnitude of the load current being drawn from the battery. Batteries, especially primary batteries have relatively large internal cell resistance, whereas secondary batteries have relatively low internal cell resistance. Primary batteries suitable for use in portable electronic devices include zinc-air batteries, carbon-zinc batteries and lithium batteries which generally have the highest internal cell resistance, and manganese-alkaline batteries and mercury batteries which have significantly lower internal cell resistance. Secondary batteries suitable for use in portable electronic devices include Nickel-cadmium batteries, nickel hydride batteries and the rechargeable lithium batteries.

The battery 118 couples to the input of the DC-DC converter 102. The DC-DC converter 102 boosts the typical B+ battery voltage of 1.3 volts to a typical B++ voltage of 2.6 to 3.0 volts, or higher as required to power electronic circuits of the electronic device. The output of the DC-DC converter couples to the input of the voltage reference 104 and to other circuits within the electronic device requiring the higher output voltage. The output of the voltage reference 104 couples to an input of the voltage divider 108, which as shown, is essentially a resistive divider to ground. The output of the voltage divider couples to one input of the differential amplifier 110. The second input of the differential amplifier 110 couples to the battery. The slope control element 112 couples to the differential amplifier 110 in a manner to be described in detail below. The output of the differential amplifier 110 couples to the input of the load control element 114. The output of the load control element 114 couples to one terminal of the high current load 116, the other terminal of the high current load 116 being coupled to the battery 118. The high current load can be, by way of example, a tactile alerting device such as a motor, an audible alerting device such as a transducer, or a visual alerting device such as an incandescent lamp or LED. An alert control signal, such as generated by a decoder in a selective call receiver, as will be described in detail below, is coupled to the input of the transducer enable control logic 106. The output of the transducer enable control logic 106 couples to a control input of the differential amplifier 110.

Figure 2:
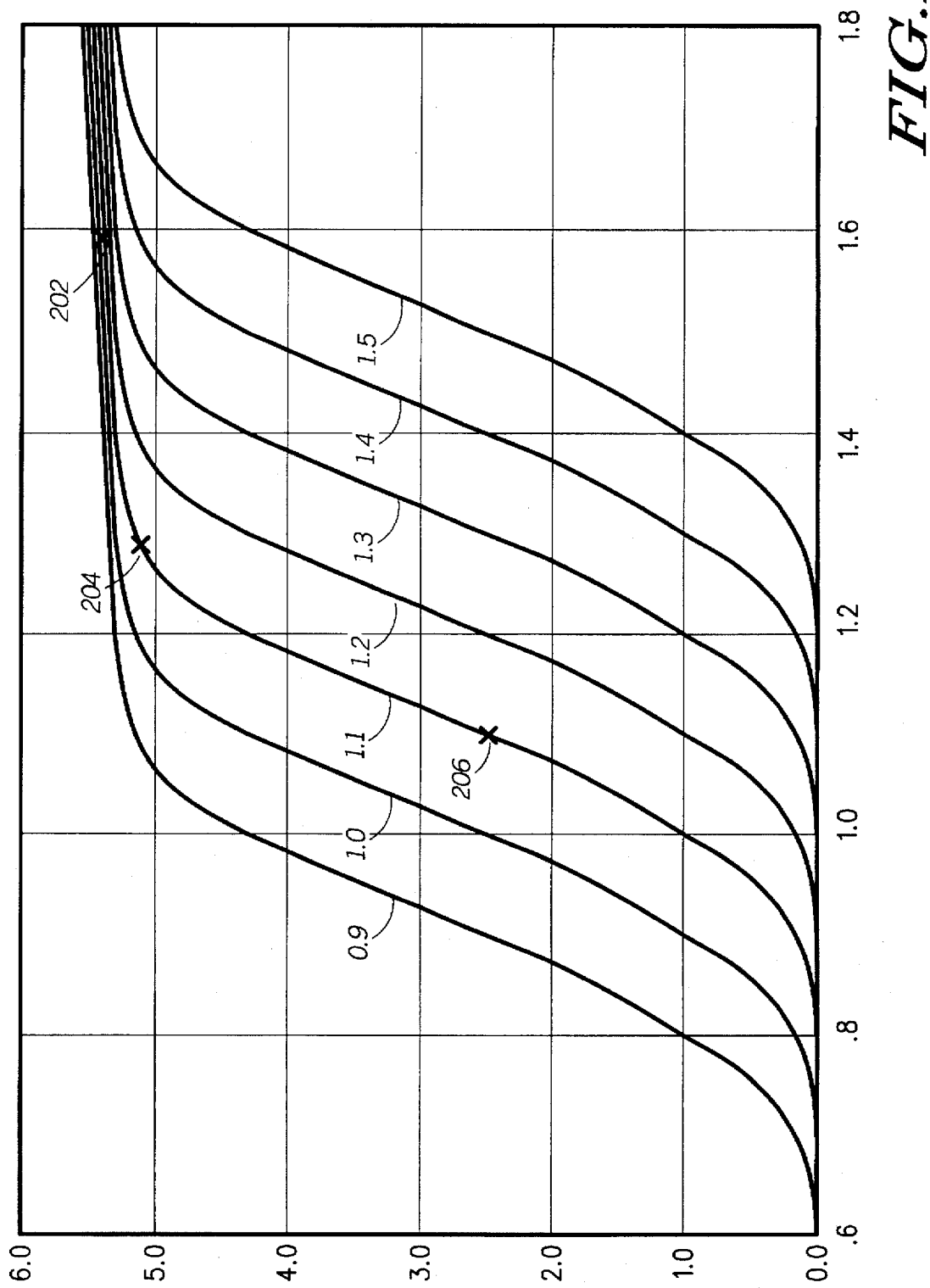
FIG. 2 is a graph depicting the operation of a related high current driver circuit providing battery overload protection.

In operation, the B+ battery voltage is boosted by the DC-DC converter 102 to the B++ voltage required to power the high voltage circuits of the electronic device. The B++ voltage is used to power the voltage reference 104 which generates a predetermined reference voltage which is substantially independent of the battery voltage. The predetermined reference voltage is coupled to the voltage divider which provides a number of taps, or outputs, each of which produces a different predetermined reference voltage lower than that generated by the voltage reference 104. The effect the different predetermined reference voltages on the operation of the driver circuit 100 is shown in FIG. 2, which is a graph depicting the operation of the high current driver circuit of Pace et al. FIG. 2 illustrates the operation of the high current driver of Pace et al. with different predetermined threshold voltages supplied, ranging between 0.9 volts and 1.5 volts. It is important to note that the rate at which the load control current is proportionally reduced remains substantially constant for any of the different predetermined threshold voltages.

Referring to FIGS. 1 and 2, the differential amplifier 110 functions as a comparator, comparing the predetermined reference voltage selected and coupled to the first input with that of the battery terminal voltage coupled to the second input. As long as the battery terminal voltage remains above the predetermined reference voltage selected, as shown in FIG. 2, the differential amplifier 110 generates a drive control signal, which is by way of example is a drive control current, at the output of the differential amplifier. The drive control current is coupled to the input of the load control element 114, which by way of example is an NPN transistor which multiplies the drive control current to a current level sufficient to drive the high current load 116. In actual operation, the drive control current drives the load control transistor into saturation which results in the actual load current being determined by the magnitude of the resistance of the high current load and the battery terminal voltage at any given time, and as shown in FIG. 2 results in a relatively constant load current depicted by the upper trace 202. As the battery terminal voltage approaches the predetermined reference voltage, such as at a point 204 when the predetermined reference voltage is set to 1.1 volts, the drive control current generated by the differential amplifier 110 is reduced in proportion to the difference between the battery terminal voltage and the predetermined reference voltage. As the battery terminal voltage approaches that of the predetermined reference voltage, such as at point 206, the load current supplied to the high current load is reduced, by way of example by approximately a factor of two, and will continue to be reduced as the battery terminal voltage drops below the predetermined threshold voltage.

Returning to FIG. 1, the transducer enable control logic 106 is utilized to switch the differential amplifier 110 from an inactive state in which no drive control current is supplied to the load control element 114, to an active state in which drive control current is supplied to the load control element 114. The switching of the differential amplifier 110 from an inactive state to an active state is in response to an alert control signal being supplied eternally. Unlike Pace et al., described above, the driver circuit 100 of the present invention includes the slope control element 112 which is coupled to the differential amplifier 110. In the preferred embodiment of the present invention, a slope control element 112 is a variable resistor which may, by way of example, be implemented using series resistors R1, R2, R3, and R4, wherein resistors, R2, R3, and R4 are shorted by trimmable links L1, L2, and L3, respectively. It will be appreciated that while only four discrete resistor values can be realized as shown, the number of discrete resistors values can be increased, or can be made continuously variable by providing different resistor trimming arrangements.

Figure 3:
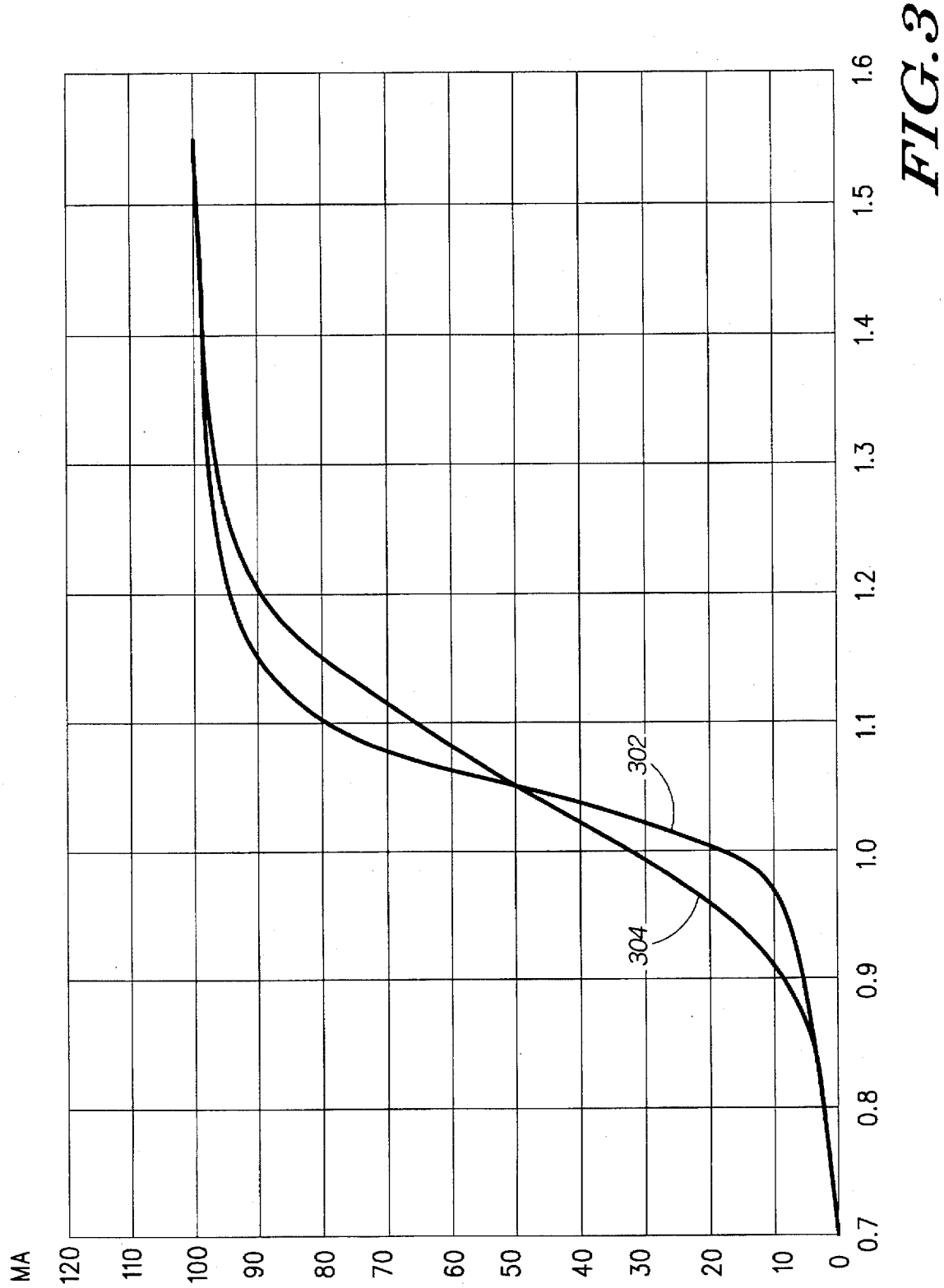
FIG. 3 is a graph depicting the operation of a driver circuit providing controllable battery overload protection in accordance with a first embodiment of the present invention.

The operation of the slope control element is best understood by reference to FIG. 1, and FIG. 3 which is a graph depicting the operation of the driver circuit 100 providing controllable battery overload protection in accordance with a first embodiment of the present invention. By way of example, curve 302 corresponds to a predetermined threshold voltage of 1.1 as shown in FIG. 2. As the slope control element 112 is adjusted, the rate at which the load control current is proportionally reduced is altered from that of curve 302 to that of curve 304. The reduced rate of change of the load control current depicted by curve 304 is more ideally suited for a battery which has a high intrinsic internal cell resistance, whereas the rate of change of the load control current depicted by curve 302 is more ideally suited for a battery having a lower intrinsic internal cell resistance. It will be appreciated that the values of resistance of the slope control element 112 can be selected for specific types of batteries. Such compensation for the internal cell resistance of a battery will provide a longer apparent battery life for a battery having a high internal cell resistance then that which would be provided if the rate of change of the load control current were held constant. The implementation of the differential amplifier 110 and slope control element 112 will be discussed in greater detail in FIG. 5 below. In summary, the range over which the drive control current proportionally reduces the current to the high current load is defined as a range of battery terminal voltages over which the current supplied to the high current load is reduced to substantially zero.

When the trimmable links L1, L2, and L3 are semiconductor switches, such as transistors or transmission gates, slope control element 112 can be controlled by a set of parameters identifying a type of battery being utilized, as will be described in further detail below.

In summary, a driver circuit 100 for driving a high current load 116 in an electronic device powered by a battery 118 which has a terminal voltage which varies substantially in relation to a level of energy being consumed from the battery 118 includes a differential amplifier 110 which is responsive to a predetermined reference voltage and to the terminal voltage of the battery 118 for generating a drive control current which proportionally reduces the current supplied to the high current load 116 when the terminal voltage is substantially equal to and lower than the predetermined reference voltage. A slope control element 112 is coupled to the differential amplifier 110 and controls the rate at which the drive control current reduces proportionally the current supplied to the high current load 116. A load control element 114 boosts the supply of current being provided to the high current load 116, and the supply of current is proportionally reduced to the high current load 116 by the load control element 114 in response to the drive control current which is generated. The predetermined reference voltage is generated either from a voltage reference 104 which can be integrated as a part of the driver circuit, or can be supplied from an external source, such as a voltage reference on another integrated circuit.

Figure 4:
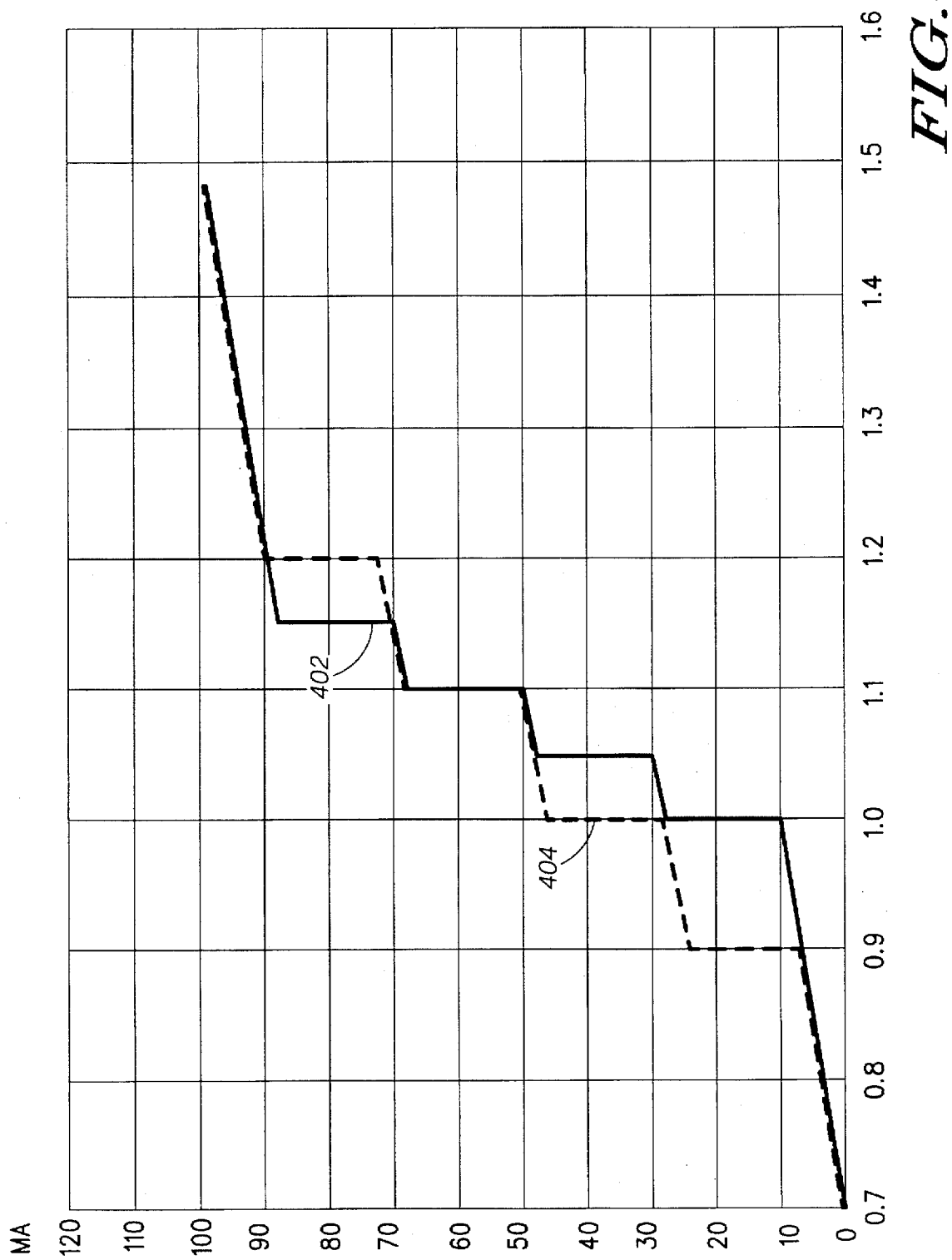
FIG. 4 is a graph depicting the operation of a driver circuit providing controllable battery overload protection in accordance with a second embodiment of the present invention.
Figure 5:
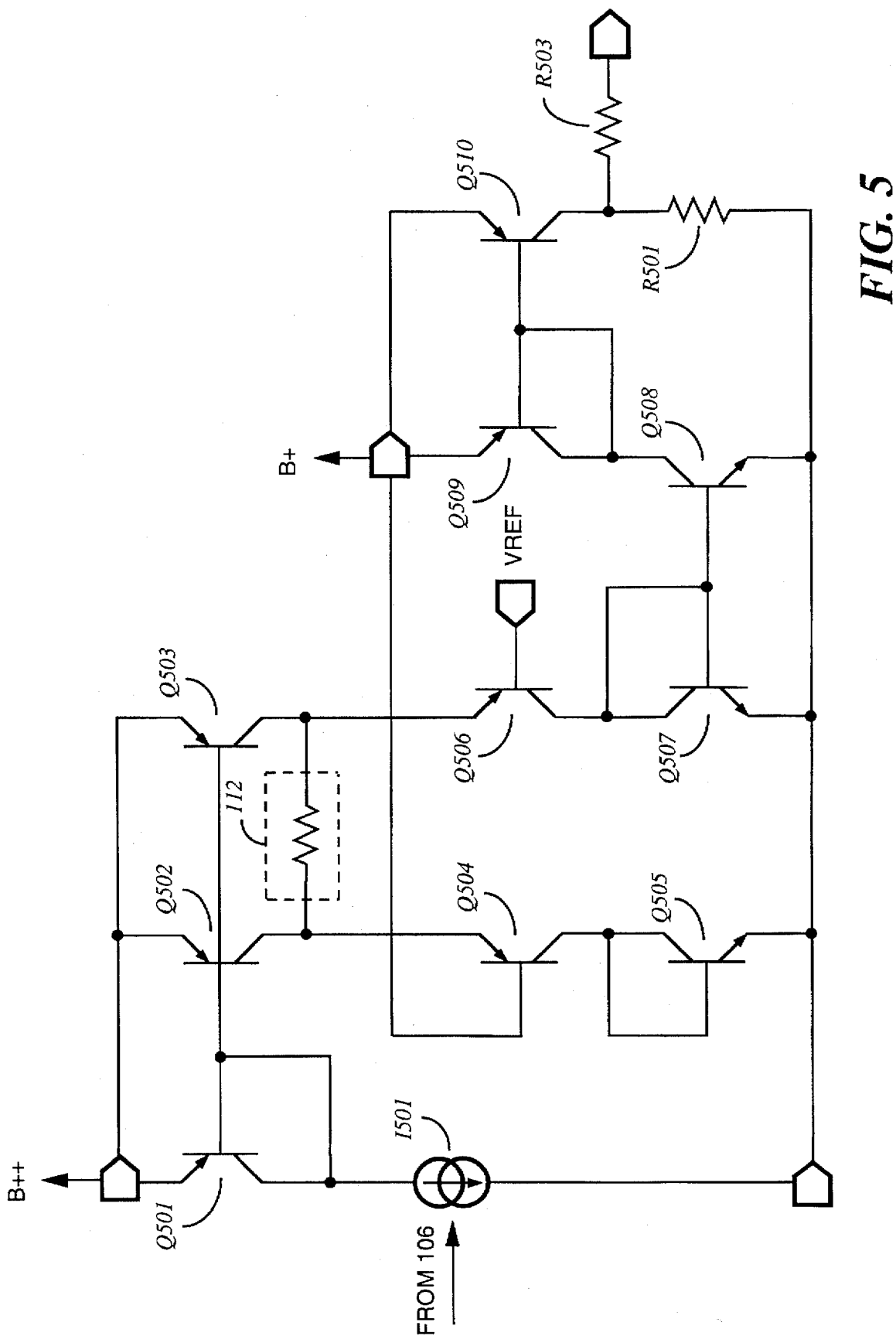
FIG. 5 is an electrical schematic diagram of the differential amplifier and slope control element in accordance with the first embodiment of the present invention.

The implementation of the slope control element 112 depicted in FIG. 3 and to be described in FIG. 5 provides a continuously varying proportional reduction in the load control current. FIG. 4 is a graph depicting the operation of the driver circuit 100 providing controllable battery overload protection in accordance with a second embodiment of the present invention. It will be appreciated that the proportional reduction on the load control current can also be performed in a series of discrete steps as shown in FIG. 4. Again, curve 402 would correspond to a predetermined threshold voltage, which by way of example is 1.1 volts as previously described above. As shown in FIG. 4, the rate at which the load control current is proportionally reduced is relatively rapid over a sequence of four current reduction steps. By adjusting the slope control element 112, the rate at which the load control element is proportionally reduced can be slowed, as shown in curve 404, wherein the same number of current reduction steps occurs, but over a longer battery voltage interval. It will be appreciated that the advantages provided by implementing a discrete stepped reduction in the load control current would be similar to that provided by the continuously proportional reduction in the load control current.

FIG. 5 is an electrical schematic diagram of the differential amplifier 110 and the slope control element 112 in accordance with the first embodiment of the present invention. The differential amplifier 110 and slope control element 112 are implemented preferably in an integrated circuit, although it will be appreciated that the differential amplifier 110 can be implemented also as a discrete integrated circuit and the slope control element 112 can be implemented as a discrete variable or otherwise trimmable resistor. The voltage divider 108, transducer enable control logic 106 and the voltage reference 104 can be integrated into the same integrated circuit as that of the differential amplifier 110 and slope control element 112, or it will be appreciated, can be singly integrated into other integrated circuits or discrete circuits providing the same function.

The differential amplifier includes a current source I501 having one terminal connected to ground and a second terminal connected to the collector terminal of a transistor Q501 which functions as a current mirror. The current source I501 has a bias control input which is responsive to a bias control signal generated by the transducer enable control logic 106 that enables the differential amplifier to be switched on and off by the transducer enable control logic 106 as described above. The collector of transistor Q501 also couples to the base terminal of transistor Q501, the base terminal of transistor Q502 and the base terminal of transistor Q503. The emitter terminals of transistors Q501, Q502 and Q503 couple to the B++ supply voltage. The collector terminal of Q502 is coupled to the emitter terminal of Q504, while the collector terminal of transistor Q503 is coupled to the emitter terminal of transistor Q506. The base terminal of transistor Q504 is coupled to the B+ supply voltage, while the base terminal of transistor Q506 is coupled to the voltage reference 104 output, either directly or through the selected output of the voltage divider 108. The collector of transistor Q504 couples to the collector terminal and base terminal of transistor Q505 while the collector terminal of transistor Q506 couples to the collector terminal and base terminal of transistor Q507 and the base terminal of transistor Q508. The emitter terminals of transistors Q505, Q507 and Q508 are coupled to ground. The collector terminal of transistor Q508 couples to the collector terminal and base terminal of transistor Q509 and to the base terminal of transistor Q510. The emitter terminals of transistors Q509 and Q510 couple to the B+ supply voltage. The collector terminal of transistor Q510 couples to a first terminal of resistor R501 and to a first terminal of resistor R503. The second terminal of resistor R501 couples to ground, while the second terminal of resistor R503 provides the drive control current to the input of the load control element 114. Transistors Q501, Q502, Q503, Q504, Q506, Q509, and Q510 are PNP transistors, and transistors Q505, Q507, and Q508 are NPN transistors. It will be appreciated that the differential amplifier described above can also be implemented in other integrated circuit technologies, such as a BiCMOS integrated circuit technology.

The slope control element 112 is preferably implemented as a discrete value or trimmable resistor which has a first terminal coupled to the collector terminal of transistor Q502 and the emitter terminal of transistor Q504, and the second terminal coupled to the collector terminal of transistor Q503 and the emitter terminal of transistor Q506.

Operationally, transistor Q501 provides a current mirror mirroring the reference current I501, preferably as a 1:1 ratio. Transistors Q502 and Q503 also function as current mirrors, mirroring the current of transistor Q501, also preferably as a 1:1 ratio. Transistors Q504 and Q506 form the active transistors of the differential amplifier 110, while transistors Q502 and Q503 set the bias current, and transistor Q505 and Q507 form active loads resistors for the differential amplifier 110. The inputs to the differential amplifier are provided at the base of transistor Q504 (coupled to B+ supply voltage) and the base of transistor Q506 (coupled to the voltage reference). The output of the differential amplifier is provided at the collector of transistor Q506 and is mirrored through a current mirror formed by transistors Q507 and Q508, also preferably as a 1:1 ratio. The output of the current mirror formed by transistor Q507 and Q508 is amplified by a current mirror formed by transistors Q509 and Q510 preferably as a 2.5:1 ratio. The output of the current mirror formed by transistors Q509 and Q510, which forms a drive control current at the collector of Q510 which is of sufficient magnitude to saturate the transistor forming the load control element 114 under normal operating conditions. While specific current ratios have been described above, it will be appreciated that the current ratios can be changed, such as when increased current gain is required.

As previously described, as the B+ supply voltage in FIG. 5 approaches the reference voltage, the drive control current is proportionally reduced thereby reducing the current supplied to the load control element 114, further reducing the current being drawn from the battery when the battery energy is near depletion, and when the resultant battery voltage is approaching a value unable to sustain operation the electronics circuits of the electronic device.

In summary, the slope control element 112 can be implemented as an integrated resistor which is preselected based on the type of battery being utilized, or can be an integrated resistor which is electrically programmable as described above, and in further detail below.

In an alternate embodiment of the present invention, which is not shown in the drawings, the current source formed by transistor Q501, and current mirrors formed by transistors Q502 and Q503 can be made to be adjustable and replace the resistor forming slope control element 112, or can be used in addition to the resistor forming the slope control element 112, thereby enabling a proportional reduction of the drive control signal without the need for the discrete resistor selection or trimming previously described above.

Figure 6:
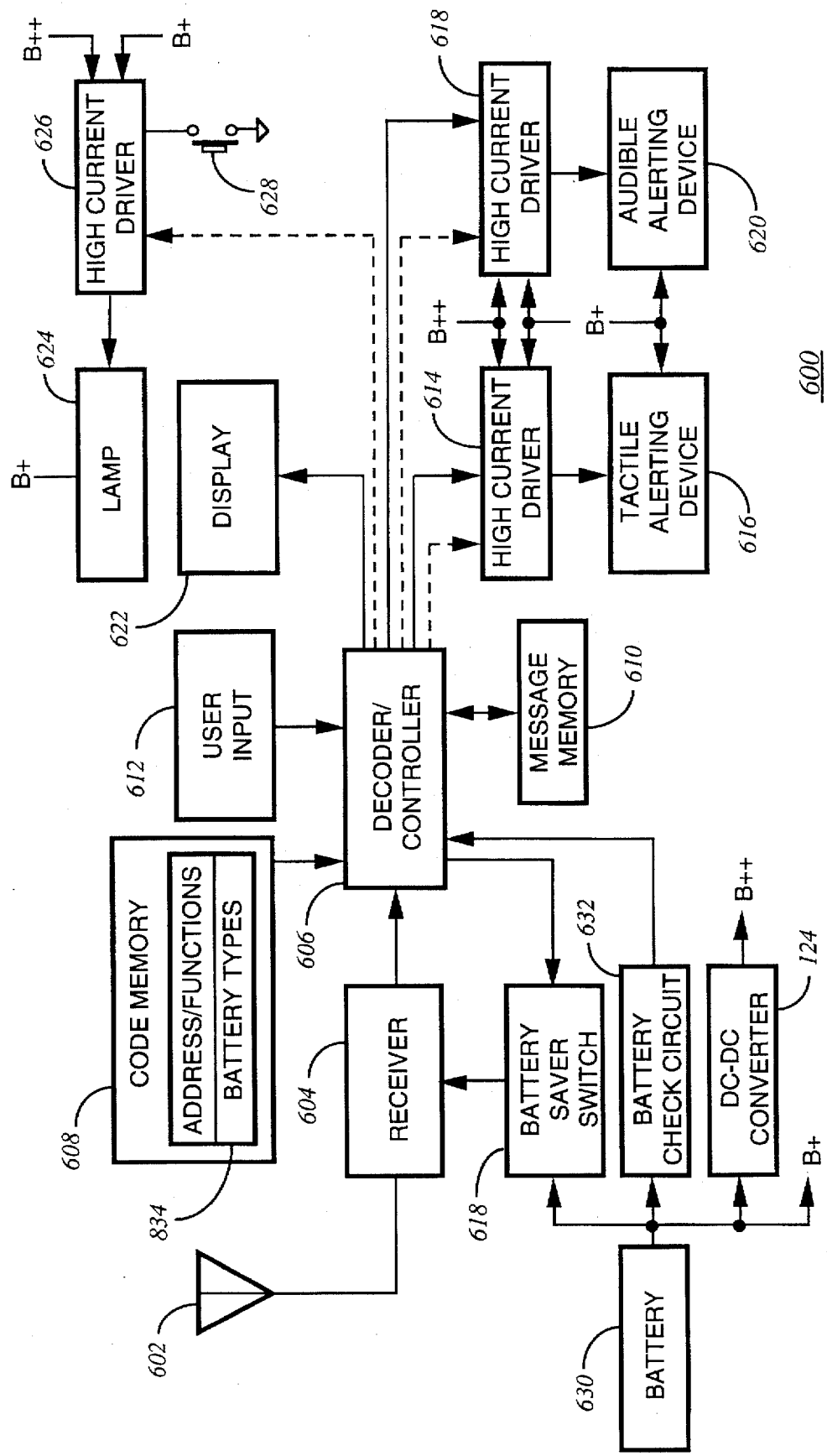
FIG. 6 is an electrical block diagram of a communication device utilizing the driver circuit of FIG. 1.

FIG. 6 is an electrical block diagram of a communication device utilizing the driver circuit of FIG. 1. The communication receiver 600 utilizes one or more driver circuits in accordance with the present invention. In operation a transmitted selective call message, which typically includes an address and a message corresponding thereto, is intercepted by an antenna 602 and is coupled into the input of a receiver 604 which receives and detects the selective call message in a manner well known to one of ordinary skill in the art, providing at the output of the receiver 604 a stream of data corresponding to the detected selective call message. The stream of data is coupled to the input of a decoder/controller 606 which processes the data including the selective call message, and when the address received in the selective call message matches an address assigned to the communication receiver 600 which is stored in a code memory 608, the message portion of the selective call message is stored in a message memory 610 for recall at a later time. An alert output signal is generated by the decoder/controller 606 which can be directed to a driver circuit 614, such as described above, which would drive a high current tactile alerting device 616, alerting silently the user that a message has been received and stored. The alert output signal can also be directed to a driver circuit 618, such as described above, which would drive a high current audible alerting device 620, alerting audibly the user that a message has been received and stored. The alert output is reset either automatically after a time-out, or by the user using user controls 612. The message stored in the message memory 610 is recalled using the user controls 612, whereupon the message is displayed on a display 622, such as an LCD display. When the ambient light level is low, the communication receiver user actuates a switch 628 which couples to the input of a driver circuit 626, such as described above, which in turn supplies power to a lamp 624, thereby providing illumination for reading the message on the display 622. It will be appreciated that the decoder/controller 606 when coupled with a photo-detector (not illustrated), can automatically provide illumination to the display 622 by switching on the driver circuit 626 after the user has activated the light function.

Power is supplied to the receiver 604 from a battery 630 via a battery saver switch 628. Operation of the battery saver switch 628 is controlled by the decoder/controller 606 in a manner well known to one of ordinary skill in the art so as to extend the normal life of the battery 630. By utilizing the driver circuits 614, 618 and 626 which provides controllable battery overload protection in accordance with the present invention, the life of the battery 630 can be further extended, as described above, including compensating for different battery types. The driver circuits 614, 618 and 626 also enable the communication receiver 600 to operate effectively, a longer battery life with batteries having high internal impedance, as described above. A battery check circuit 632 is coupled to the battery and monitors the battery terminal voltage. When the battery terminal voltage drops to a predetermined battery check level, a low battery warning signal is generated which is coupled to the decoder/controller 606, which in turn generates a low battery alert signal which is coupled either to the driver circuit 614 which would drive a high current tactile alerting device 616, alerting silently that the battery 630 needs replacement, or to a driver circuit 618 which would drive a high current audible alerting device 620, alerting audibly the user that the battery 630 needs replacement. When the driver circuits 614, 618 and 626 providing controllable battery overload protection are utilized in combination with a battery check circuit and the ability to compensate for different types of batteries, the communication receiver user is provided with additional time during which a replacement battery must be obtained, before the receiver 604 becomes completely non-operative. While the driver circuit 100 has been described above as being coupled to a voltage reference 104, it will be appreciated that when multiple driver circuits, such as driver circuits 614, 618 and 626 are integrated onto a common semiconductor die, only a single voltage reference is required for the multiple high current driver circuits. It will also be appreciated that the voltage reference 104 can also be integrated into a separate die, providing a voltage reference for a multiplicity of driver circuits driving various high current devices within a single electronic device as will be described further below.

As previously described above, the DC-DC converter 102 supplies power to those circuits in the electronic device, such as the communication receiver, which require a higher supply voltage, and is also coupled to the driver circuits 614, 618 and 626, to provide a voltage source isolated from the battery voltage.

It will be appreciated that the code memory 608, previously described above can store not only address information, but can also be used as a means for storing a set of parameters 634 identifying the type of battery which can be utilized within the communication receiver. When so configured, the user input 612 can be utilized to select the type of battery currently installed in the communication receiver, and once selected, the controller 606 would select the proper value for the slope control element 112, such that the rate at which drive control current proportionally reduces the current supplied to the high current load is set according to the type of battery being utilized. The controller control inputs to the driver circuits 614, 618 and 626 from the controller 606 which would be utilized to select the value of the slope control element 112 are identified as dashed lines. It will also be appreciated that a "tab" on the battery could serve to tell the pager which type of battery and, therefore, which value the slope control element 112 is to be employed. This "tab" could also control the voltage reference value and thereby control the potential that overload potential begins.

In addition to optimizing the performance of the driver circuit for different types of batteries, the performance of the driver circuit can also be optimized for different types of high current loads. Motors, in particular, which are typically used to provide a tactile alert have a high inrush current as the motor is started and settles to a lower load current during operation. Likewise, incandescent lamps which are typically used to provide backlighting have a high inrush current when the lamp is cold and settles to a lower load current as the filament heats up. Transducers which are typically used to provide an audible alert and other resistive loads have little to no inrush current and settle to a load current dictated by the device resistance. When multiple driver circuits are utilized in a single electronic device, as described above, the value of the slope control element 112 can be selected for optimal performance with the type of high current load that is being driven. Thus the slope control element 112 of the tactile alert driver would be set to a value typical of curve 302 where the driver circuit is more responsive to changes in the high current load. Likewise, the slope control element 112 of the driver providing backlighting would be set to a value typical of that between curve 302 and curve 304 where the driver circuit is not as responsive to changes in the high current load. And finally, the slope control element 112 of the audible alert driver would be set to a value typical of curve 304 where the driver circuit is less responsive to changes in the high current load. By adjusting the value of the slope control element to the type of high current load being driven, the perceived performance of the electronic device is significantly enhanced when used separately or in combination with changes to compensate for the type of battery in use.

In summary, what has been described above is a driver circuit 100 which provides controllable battery overload protection. The driver circuit 100 described above monitors the loaded battery terminal voltage, and when the loaded battery terminal voltage falls to a predetermined voltage threshold, the drive control current supplied to a high current device, such as an alerting device, or a display illumination device, gradually is reduced. By gradually reducing the current to the high current devices, the perceived performance of the high current devices is only gradually degraded over time, while the battery life is effectively extended. The driver circuit 100 can be implemented from discrete components, or preferably would be an integrated driver circuit to minimize component count and cost.

When the driver circuit 100 in accordance with the present invention is utilized in a battery powered electronic device, such as a laptop computer, a communication receiver, or other electronic device which includes high current load devices as described above, the extension of battery life obtained by providing controllable battery overload protection enables the user to reliably carry out calculations or to receive messages for a greater period of time before the battery must be replaced. The circuit 100 improves the battery life with batteries having high internal cell resistance.

We claim:

1. A driver circuit for driving a high current load in an electronic device powered by a battery having a terminal voltage which varies substantially in relation to a level of energy being consumed from the battery, said driver circuit comprising:

a differential amplifier responsive to a predetermined reference voltage and further responsive to the terminal voltage for generating a drive control signal which proportionally reduces a current supplied to the high current load when the terminal voltage is substantially equal to and lower than the predetermined reference voltage;

a slope control element, coupled to said differential amplifier for controlling a rate at which the drive control signal reduces proportionally the current supplied to the high current load; and a load control element which provides a supply of current to the high current load, the supply of current being proportionally reduced in response to the drive control signal.

2. The driver circuit according to claim 1, wherein the predetermined reference voltage is supplied to said differential amplifier from an external source, and wherein the rate at which the drive control signal proportionally reduces the current supplied to the high current load is independent of the predetermined reference voltage supplied.

3. The driver circuit according to claim 2, further comprising means for storing a set of parameters identifying a type of battery being utilized, and wherein the rate at which drive control signal proportionally reduces the current supplied to the high current load can be set according to the type of battery being utilized.

4. The driver circuit according to claim 1, wherein the rate at which the drive control signal proportionally reduces the current to the high current load is defined as a range of terminal voltages over which the current supplied to the high current load is reduced to substantially zero.

5. The driver circuit according to claim 1, wherein said slope control element is an integrated resistor.

6. The driver circuit according to claim 5, wherein said integrated resistor is electrically programmable.

7. The driver circuit according to claim 1, wherein said slope control element is a current source.

8. The driver circuit according to claim 1, wherein said differential amplifier has a bias control input responsive to a bias control signal, for selectively switching said differential amplifier from an active state for providing a supply of current to the high current load, to an inactive state for inhibiting the supply of current to the high current load.

9. The driver circuit according to claim 8, wherein said load control element is responsive to the drive control signal for supplying current to the high current load when said differential amplifier is in the active state and the terminal voltage is greater than the predetermined reference voltage, and further proportionally reduces the current supplied to the high current load when said differential amplifier is in the active state and the terminal voltage is substantially equal to the predetermined reference voltage.

10. A driver circuit for driving a high current load in an electronic device powered by a battery having a terminal voltage which varies substantially in relation to a level of energy being consumed from the battery, said driver circuit comprising:

a voltage reference for generating a predetermined reference voltage;

a differential amplifier responsive to the predetermined reference voltage and further responsive to the terminal voltage for generating a drive control signal which proportionally reduces a current supplied to the high current load when the terminal voltage is substantially equal to and lower than the predetermined reference voltage;

a slope control element, coupled to said differential amplifier for controlling a rate at which the drive control signal proportionally reduces the current supplied to the high current load; and a load control element which provides a supply of current to the high current load, the supply of current being proportionally reduced in response to the drive control signal.

11. The driver circuit according to claim 10, wherein the predetermined reference voltage can be externally set, and wherein the rate at which the drive control signal proportionally reduces the current supplied to the high current load is independent of the predetermined reference voltage which is settable externally.

12. The driver circuit according to claim 11, further comprising means for storing a set of parameters identifying a type of battery being utilized, and wherein the rate at which drive control signal proportionally reduces the current supplied to the high current load can be set according to the type of battery being utilized.

13. The driver circuit according to claim 10, wherein the range over which the drive control signal proportionally reduces the current to the high current load is defined as a range of terminal voltages below the predetermined reference voltage over which the current supplied to the high current load is reduced to substantially zero.

14. The driver circuit according to claim 10, wherein said slope control element is an integrated resistor.

15. The driver circuit according to claim 14, wherein said integrated resistor is electrically programmable.

16. The driver circuit according to claim 10, wherein said slope control element is a current source.

17. The driver circuit according to claim 10, wherein said differential amplifier has a bias control input responsive to a bias control signal, for selectively switching said differential amplifier from an active state for providing a supply of current to the high current load, to an inactive state for inhibiting the supply of current to the high current load.

18. The driver circuit according to claim 17, wherein said load control element is responsive to the drive control signal for supplying current to the high current load when said differential amplifier is in the active state and the terminal voltage is greater than the predetermined reference voltage, and further proportionally reduces the current supplied to the high current load when said differential amplifier is in the active state and the terminal voltage is substantially equal to the predetermined reference voltage.

19. The driver circuit according to claim 10, wherein the rate at which the drive control signal proportionally reduces the current supplied to the high current load is selectable based on the type of high current load being driven.

20. A communication receiver powered by a battery having a terminal voltage which varies in relation to a level of energy consumption from the battery, comprising:

a receiver for receiving and detecting coded message signals including an address signal;

a decoder, responsive to the address signal received, for generating an alert enable signal when the address signal received matches a predetermined address designating the communication receiver;

a high current alerting device, responsive to the alert enable signal, for generating a sensible alert;

a high current driver, comprising a voltage reference for generating a predetermined reference voltage;

a differential amplifier responsive to the predetermined reference voltage and further responsive to the terminal voltage for generating a drive control signal which proportionally reduces a current supplied to the high current load when the terminal voltage is substantially equal to and lower than the predetermined reference voltage;

a slope control element, coupled to said differential amplifier for controlling a rate at which the drive control signal proportionally reduces the current supplied to the high current load; and a load control element which provides a supply of current to the high current load, the supply of current being proportionally reduced in response to the drive control signal.

* * * * *